United States Patent
Khizroev et al.

(10) Patent No.: US 10,234,347 B1
(45) Date of Patent: Mar. 19, 2019

(54) RAPID AND WIRELESS SCREENING AND HEALTH MONITORING OF MATERIALS AND STRUCTURES

(71) Applicants: Sakhrat Khizroev, Miami, FL (US); Rakesh Guduru, Miami, FL (US); Dwayne McDaniel, Miramar, FL (US)

(72) Inventors: Sakhrat Khizroev, Miami, FL (US); Rakesh Guduru, Miami, FL (US); Dwayne McDaniel, Miramar, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 15/852,254

(22) Filed: Dec. 22, 2017

(51) Int. Cl.
| | | |
|---|---|---|
| *G01R 31/30* | (2006.01) | |
| *G01L 1/24* | (2006.01) | |
| *G02B 27/28* | (2006.01) | |
| *H01F 1/00* | (2006.01) | |
| *G01L 1/12* | (2006.01) | |
| *H01L 41/187* | (2006.01) | |
| *H01F 27/28* | (2006.01) | |
| *H01F 27/255* | (2006.01) | |
| *H01F 1/34* | (2006.01) | |

(52) U.S. Cl.
CPC ........... *G01L 1/247* (2013.01); *G01L 1/12* (2013.01); *G02B 27/288* (2013.01); *H01F 1/0045* (2013.01); *H01F 1/344* (2013.01); *H01F 27/255* (2013.01); *H01F 27/2804* (2013.01); *H01L 41/1871* (2013.01)

(58) Field of Classification Search
None
See application file for complete search history.

(56) References Cited

U.S. PATENT DOCUMENTS

| | | | | |
|---|---|---|---|---|
| 6,057,677 A | * | 5/2000 | Wakana | G01R 13/347 324/754.06 |
| 6,407,560 B1 | * | 6/2002 | Walraven | G01R 31/2853 324/754.23 |
| 2017/0290916 A1 | * | 10/2017 | Kaushik | A61K 47/48953 |

* cited by examiner

*Primary Examiner* — Jermele M Hollington
(74) *Attorney, Agent, or Firm* — Saliwanchik, Lloyd & Eisenschenk

(57) ABSTRACT

Systems for screening and health monitoring of materials are provided. The system can include a material embedded with magneto-electric nanoparticles (MENs), a laser configured to direct incident laser light waves at a target area of the material, an optical filter disposed between the laser and the material, and an analyzer configured to detect the laser light reflected from the material.

11 Claims, 6 Drawing Sheets

RAPID AND WIRELESS SCREENING AND HEALTH MONITORING OF MATERIALS AND STRUCTURES

STATEMENT OF GOVERNMENT SUPPORT

This invention was made with government support under Grant No. ECCS-093951 awarded by National Science Foundation. The government has certain rights in the invention.

BACKGROUND

Materials play a key role in many modern application areas and industries including electronics and magnetic information processing, civil engineering, medicine, and many others. In each of these application areas, the notion of quality is largely defined by the quality of the materials used. It is not surprising that any technology to rapidly screen and/or continuously monitor key material characteristics, whether it is structural defects, quality of adhesive bonds, or purity of thin films and nano-structural compositions, would be of great importance to any of the above industries.

BRIEF SUMMARY

Embodiments of the subject invention offer devices, systems, and methods capable of wirelessly monitoring fundamental properties of materials and devices at the nanoscale. Immediate and/or future applications include materials health monitoring devices in electronics and magnetic information processing such as the emerging field of spintronics, civil engineering, or medicine.

DETAILED DESCRIPTION

Figure 1:
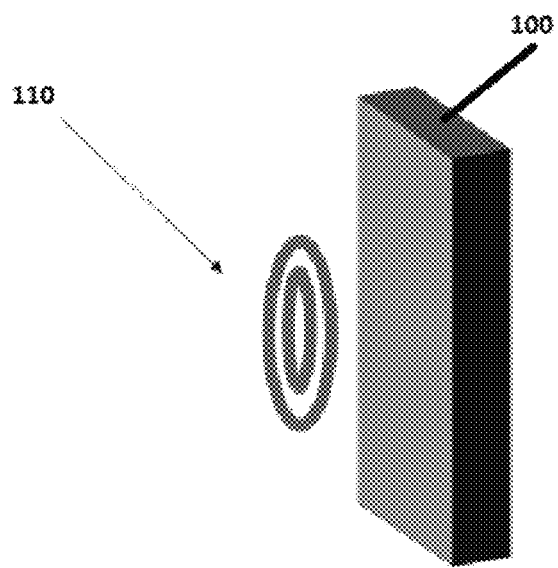
FIG. 1 shows an illustration of a B-H loop scanning coil positioned to detect a signal from an integrated magneto-electric nanoparticle (MEN) structure.

Embodiments of the subject invention provide systems, devices, and methods for rapid wireless screening and health monitoring of nanoscale materials and nanostructures. Magneto-electric nanoparticles (MENs) can be integrated into materials or structures at a macro-, micro-, or nano-scale level to enable wireless monitoring of the health of the materials or structures. As a result of a non-zero magneto-electric (ME) effect, external magnetic fields can be applied to an existing material or structure to induce a response from the MENs. This signal response can be used to monitor intrinsic electric fields, which underlie molecular bonds, stress effects in nanocomposites, structural defects, and other important properties. A change of an intrinsic electric field in the vicinity of MENs induces a change of the MENs' magnetization, according to the ME effect. The change in the MENs magnetization can be remotely (wirelessly) detected via traditional magnetometry approaches. Unlike other nanoparticles, MENs have both magnetic and electric dipole moments, which are coupled together due to a relatively strong quantum-mechanical interaction. As a result, the electric dipole moment of the nanoparticle, p, is proportional to an external magnetic field, H. This can be based on the following isotropic relationship:

$$p = \alpha H, \quad (1)$$

where $\alpha$ is the ME coefficient. In general, the ME coefficient is defined by an anisotropic tensor, $\alpha_{ij}$. However, the above simplified expression is more than adequate for description provided herein.

Although electric fields underlie the most fundamental chemical bonds in materials, in general it is not possible to use electric fields to wirelessly monitor the quality of the bonds. The externally generated fields would interfere with the complex electric field background in the entire material and therefore, it would be difficult to separate the information carried by the electric fields due individual bonds from the information carried by the rest of the global electric field system. On the contrary, MENs embedded into the material, magnetic external fields, instead of electric fields, can be used effectively detect a signal response. The magnetic fields surrounding the MENs are not substantially affected by an electric-field background. As a result, only the electric-field-driven bonds close to the embedded MENs will contribute to the detected magnetic signal. Due to the non-zero ME effect, a change in the electric field profile results in a detectable change of the MENs' magnetization. Embodiments of the subject invention can detect a magnetic signal emanating from the local sites in the vicinity of MENs using a number of existing magnetometry approaches, e.g., BH-looper, vibrating sample magnetometry (VSM), alternating gradient magnetometry (AGM), or magneto-optical Kerr effect (MOKE) magnetometry.

Embodiments of the subject invention can be used to measure mechanical stress in thin film devices. At a fundamental physical level, the stress location and/or any resulting defect would induce a local electric field profile change. In practice, such a local change is difficult to detect without attaching direct electrical contacts to the location of the defect, which would make such a device impractical. On the other hand, magnetic fields can non-destructively propagate through both conducting and insulating materials as long as these materials are non-magnetic. Therefore, MENs can be embedded locally into a material used to convert local electric field changes resulting from a stress or a crack into a magnetic field which can be wirelessly detected. Consequently, MENs can be used for monitoring the material's health at the nanoscale level to warn of an excessive stress or a potential crack at its very early stage of development.

Embodiments of the subject invention can use a local or global magnetometer (depending on a specific application) to propagate electromagnetic waves towards a MENs integrated material and scan the surface or the volume of the material to detect anomalous magnetic signature profiles characteristic of a mechanical stress or defect. Embodiments of the subject invention can use BH-loop measurements or the focused magneto-optical Kerr effect (MOKE) to scan MENs integrated structures, as illustrated in FIGS. 1 and 2, respectively.

For the BH-loop device, as seen in FIG. 1, a signal response can be due to the change of the magnetic induction of a system of coils 110 in the presence of MENs embedded in a sample 100 within a region around the coil and the region being defined by the smaller radius of the coil. In this case, an AC signal in the range of from 100 Hz to over 1 GHz, depending on an application requirement, can be driven through the internal single- or multi-turn coil 110. The number of turns can depend upon the required localization region of each scan point. An induced electromotive force (EMF) signal propagated through the external single or multi-turn coil can detected at the same frequency. For many applications requiring low-frequency measurements, for example between 0 and 1 kHz, a relatively large number of turns in both coils can be used to increase the measurement signal-to-noise ratio (SNR). For a high frequency application, the number of turns can be decreased, for example to below 100, thereby increasing the current, for example to above 10 A. The diameter of the inner circle can vary from a sub-mm to over a cm, depending on the required detection depth. In other words, the diameter can scale with the thickness of the scanned device. The diameter of the outer circle can be scaled comparably to the inner circle.

Figure 2:
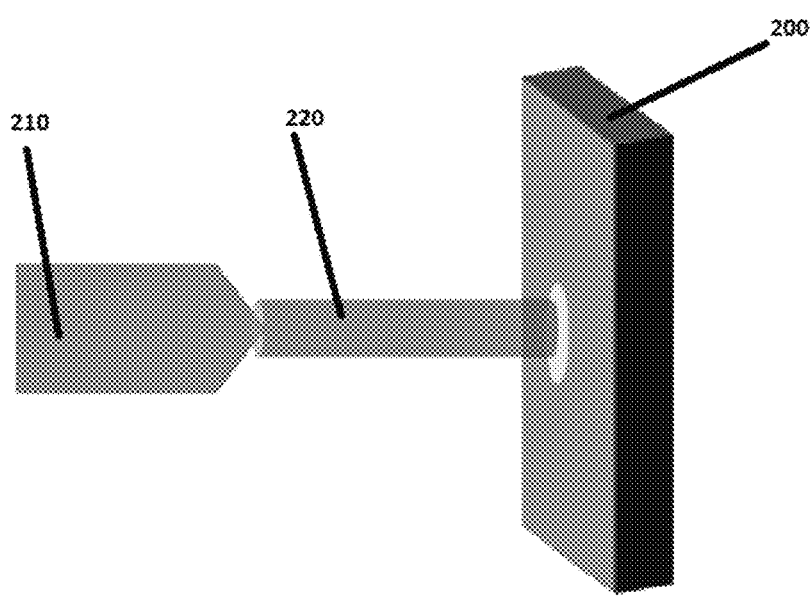
FIG. 2 shows an illustration of a magneto-optical Kerr effect (MOKE) device positioned to detect a signal from an integrated magneto-electric nanoparticle (MEN) structure.

As seen in FIG. 2, a system can alternatively detect a Faraday rotation of the electromagnetic wave. A monochromatic laser source 210 directing a laser beam 220 towards the magnetic component of the MENs in the target material 200; the signal can be measured in the reflection or transmission mode by an analyzer. Both sources can be used for rapid screening through scanning the surface of a material under study. Again, many other embodiments are possible, including other magnetometry approaches depending on the particular application.

Figure 3:
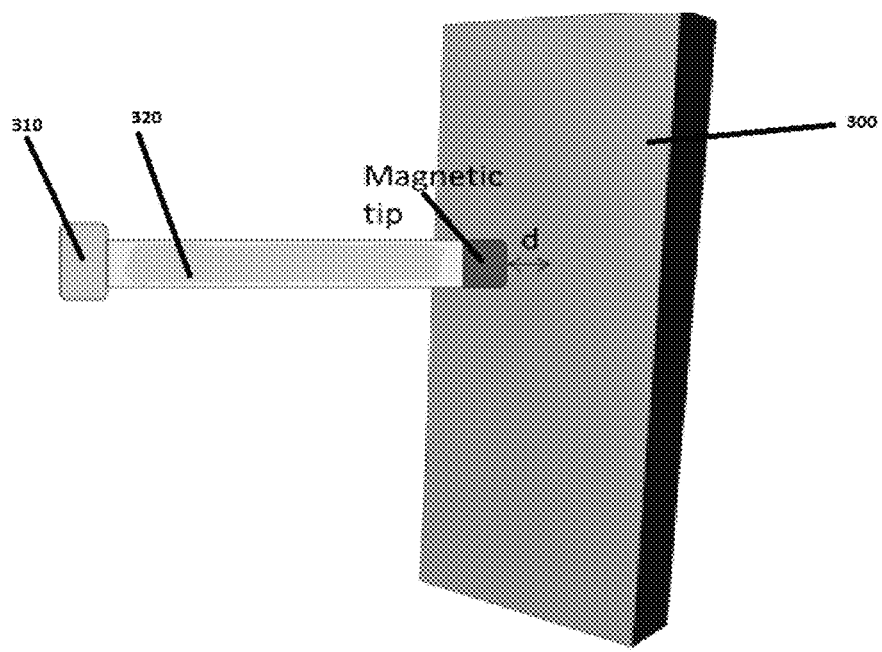
FIG. 3 shows an illustration of an alternating gradient magnetometer positioned to detect a signal from an integrated magneto-electric nanoparticle (MEN) structure.

Another embodiment including an alternating gradient magnetometer can be seen in FIG. 3. In this case, a scanner can include a nano-, micro-, or mm-size probe made from a non-magnetic solid material 320, such as quartz and the tip of the probe 320 can be made from a magnetic material. The probe attached to a piezoelement 310 is induced to oscillate at its resonant frequency by applying an AC voltage to the piezoelement. The probe 320 can scan a sample surface 300 at a constant distance, d, from the sample; the resonant frequency of the probe 320 is altered by the interaction between the magnetic probe tip and the magnetic properties of the surface 300 in closest proximity to the tip, as illustrated in FIG. 3. The magnetic field generated by the MENs is altered in regions containing a defect or a crack. As the magnetic tip of the probe 320 detects an altered magnetic field, the mechanical resonant frequency of the probe 320 will change due to interaction with the altered magnetic field. The nanoscale dimensions of the MENs can allow the device to detect the minute changes in the bond quality. A resonant frequency of the probe 320 can be measured through the impedance of a capacitive or inductive circuit supplying the AC voltage to the piezoelement 310 or using the reflection of an external electromagnetic source, such as a laser or a light emitting diode (LED), shining to a region on the probe 320 or the piezoelement 310.

Figure 4:
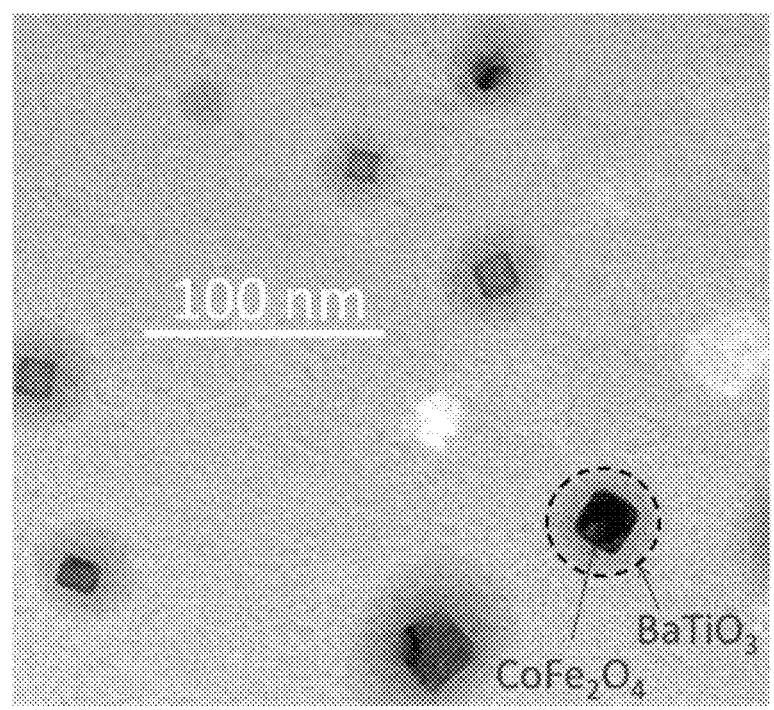
FIG. 4 shows a transmission electron microscopy (TEM) image of a structure containing magneto-electric nanoparticles.

FIG. 4 shows a transmission electron microscopy (TEM) image of MENs illustrating their structure. The MENs can be made of a ferromagnetic core of cobalt ferrite ($CoFe_2O_4$) with a piezoelectric shell made of barium titanate ($BaTiO_3$). The average size of the MENs in FIG. 4 is approximately 30 nm. In some embodiments of the subject invention, the MENs can range in size from below 10 nm to over 100 nm. It should be appreciated by one of ordinary skill in the art that the MENs can be made from any other composition with a non-zero ME effect and compatibility with other materials. In preferred embodiments the nanoparticle crystal structure matches the crystallinity of the target materials being monitored.

In order to fabricate the material embedded with MENs, a quantity of MENs can be mixed with source material necessary to fabricate a target material. For example MENs can be integrated with an adhesive or a bonding agent prior to hardening. The source material can then be processed to form the target material and deployed for a specific application.

Figure 6:
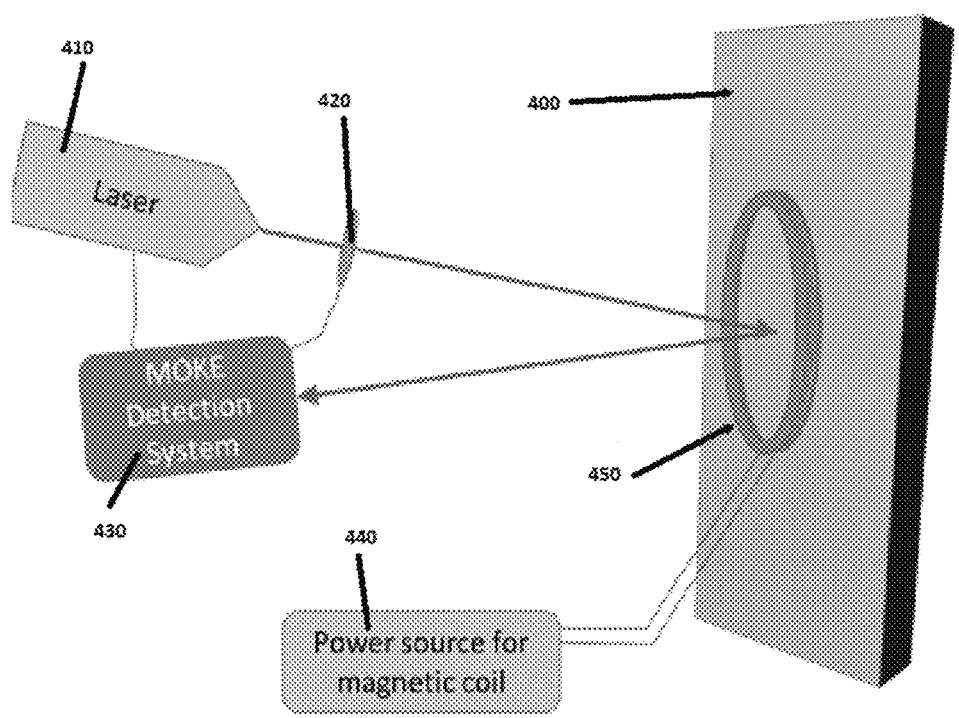
FIG. 6 shows a diagram of a magneto-optical Kerr effect (MOKE) device and a B-H loop scanning coil positioned to detect a signal from an integrated magneto-electric nanoparticle (MEN) structure.

A system for wireless screening and health monitoring can be seen in at least FIG. 6. A laser producing device 410 can direct a light waves towards a sample surface 400. The laser can be a diode laser having a wavelength of 408 nm, 532 nm, and 650 nm. An optical filter or polarizer 420 can be placed between the laser 410 and sample surface 400 to manage the specific polarization of light waves that are permitted to pass through to the sample surface. An analyzer, for example a Kerr microscope or a MOKE detection system 430, can receive light waves reflected of the surface of the sample. A change of the phase of the reflected light waves from the incident light waves is proportional to the magnetization of the locally exposed region of the sample. The second polarizer (not shown) can be positioned between the surface of the sample and the analyzer 430. In certain embodiments a single optical filter or polarizer can be utilized to filer incident light waves from the laser source to the material surface and reflected light waves from the surface material to the analyzer. The analyzer can detect a difference in the light polarization and intensity of the incident light waves and the reflected light waves.

Additionally, a power source, including a waveform generator, 440 can be electrically connected to a single- or multi-turn conductive coil. The waveform generator can drive an AC signal through the coil thereby inducing a magnetic field. A magnetic field sweep or frequency sweep can be conducted and the detected signal response can be used in order to create a localized M-H hysteresis loop. The M-H hysteresis loops can be compared to previously detected control loops to determine the health of the material at a target position. For example, MENs can saturate at a relatively small magnetic field on the order of 100 Oersteds (Oe), an electric current on the order of a an Ampere (A) through a coil with approximately 1000 turns and a diameter of 1 mm can generate a field on the order of 1,000 Oe in the localized region of the sample material.

Embodiments of the subject invention can monitor a sample surface in polar, longitudinal, transverse, and quadratic MOKE geometries. For polar MOKE detection the magnetic field of orientation is parallel to the plane of incidence and normal to the sample surface. For longitudinal MOKE detection the magnetic field of orientation is parallel to the plane of incidence and the ample surface. For transverse MOKE detection, the magnetic field of orientation is normal to the plane of incidence and parallel to the sample surface.

The methods and processes described herein can be embodied as code and/or data. The software code and data described herein can be stored on one or more machine-readable media (e.g., computer-readable media), which may include any device or medium that can store code and/or data for use by a computer system. When a computer system and/or processor reads and executes the code and/or data stored on a computer-readable medium, the computer system and/or processor performs the methods and processes embodied as data structures and code stored within the computer-readable storage medium.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that is capable of storing computer-readable information/data. Computer-readable media should not be construed or interpreted to include any propagating signals. A computer-readable medium of the subject invention can be, for example, a compact disc (CD), digital video disc (DVD), flash memory device, volatile memory, or a hard disk drive (HDD), such as an external HDD or the HDD of a computing device, though embodiments are not limited thereto. A computing device can be, for example, a laptop computer, desktop computer, server, cell phone, or tablet, though embodiments are not limited thereto.

The subject invention includes, but is not limited to, the following exemplified embodiments.

Embodiment 1

A system for screening and health monitoring of materials, the system comprising:
a material embedded with magneto-electric nanoparticles (MENs);
a laser configured to direct incident laser light waves at a target area of the material;
an optical filter disposed between the laser and the material; and
an analyzer configured to detect characteristics of the laser light reflected from the material.

Embodiment 2

The system according to embodiment 1, the MENs being comprised of a ferromagnetic core.

Embodiment 3

The system according to embodiment 2, the system further comprising a piezoelectric shell surrounding the ferromagnetic core.

Embodiment 4

The system according to any of embodiments 2-3, the ferromagnetic core being comprised of cobalt ferrite ($CoFe_2O_4$).

Embodiment 5

The system according to any of embodiments 2-4, the piezoelectric shell being comprised of barium titanate ($BaTiO_3$).

Embodiment 6

The system according to any of embodiments 1-5, a diameter of the MENs being a width within a range of from 10 nm to 100 nm.

Embodiment 7

The system according to any of embodiments 1-6, the first optical filter being configured to permit a specific polarization of incident light waves to pass from the laser to the material.

Embodiment 8

The system according to any of embodiments 1-7, the laser being a diode laser.

Embodiment 9

The system according to any of embodiments 1-8, the laser being configured to emit light waves at a wavelength of 408 nm, 532 nm, and 650 nm.

Embodiment 10

The system according to any of embodiments 7-9, further comprising a second optical filter disposed between the material and the analyzer; the second optical filter being configured to permit a specific polarization of reflected light waves to pass from the material to the analyzer.

Embodiment 11

The system according to any of embodiments 1-6 or 8, further comprising a single optical filter having a first surface facing the laser and the analyzer and a second surface facing the sample surface; the optical filter being configured to permit a specific polarization of incident light waves to pass through from the laser to the material and reflected light waves from the material to the analyzer.

Embodiment 12

The system according to any of embodiments 1-11, the analyzer comprising a processor in operable communication with a computer-readable medium having instructions stored thereon that, when executed, cause the processor to:
detect the a phase change difference between the incident light waves and the reflected light waves.

Embodiment 13

A system for screening and health monitoring of materials, the system comprising:
a material embedded with magneto-electric nanoparticles (MENs);
a conductive coil disposed at a target position on a surface of the material;
a power source electrically connected to the conductive coil; and an analyzer configured to detect the magnetic characteristics of the conductive coil.

Embodiment 14

The system according to embodiment 13, the MENs being comprised of a ferromagnetic core and a piezoelectric shell surrounding the ferromagnetic core.

Embodiment 15

The system according to embodiment 14, the ferromagnetic core being comprised of cobalt ferrite ($CoFe_2O_4$).

Embodiment 16

The system according to any of embodiments 14-15, the piezoelectric shell being comprised of barium titanate ($BaTiO_3$).

Embodiment 17

The system according to any of embodiments 13-16, a diameter of the MENs being a width within a range of from 10 nm to 100 nm.

Embodiment 18

The system according to any of embodiments 13-17, the conductive coil being a single turn coil.

Embodiment 19

The system according to any of embodiments 13-17, the conductive coil being a multi-turn coil.

Embodiment 20

The system according to any of embodiments 13-19, the power source being configured to transmit an alternating current (AC) signal to the conductive coil in a range of from 100 Hz to 1 GHz.

Embodiment 21

The system according to any of embodiments 13-20, the analyzer further comprising a processor in operable communication with a computer-readable medium having instructions stored thereon that, when executed, cause the processor to:
cause an alternating current (AC) signal to be transmitted to the conductive coil in a range of from 100 Hz to 1 GHz;
detect a signal response over the range; and
generate an M-H hysteresis loop.

Embodiment 22

A system for screening and health monitoring of materials, the system comprising:
a material embedded with magneto-electric nanoparticles (MENs); and
a means for detecting a magnetic signal from the material.

Embodiment 23

The system according to embodiment 22, the MENs being comprised of a ferromagnetic core and a piezoelectric shell surrounding the ferromagnetic core.

Embodiment 24

The system according to embodiment 23, the ferromagnetic core being comprised of cobalt ferrite ($CoFe_2O_4$).

Embodiment 25

The system according to any of embodiments 23-24, the piezoelectric shell being comprised of barium titanate ($BaTiO3$).

Embodiment 26

The system according to any of embodiments 22-25, a diameter of the MENs being a width within a range of from 10 nm to 100 nm.

Embodiment 27

The system according to any of embodiments 22-26, the means comprising:
a laser configured to direct incident laser light waves at a target area of the material;
an optical filter disposed between the laser and the material; and
an analyzer configured to detect the laser light reflected from the material,
the first optical filter being configured to permit a specific polarization of the incident light waves to pass from the laser to the material, and
the analyzer comprising a processor in operable communication with a computer-readable medium having instructions stored thereon that, when executed, cause the processor to detect a phase change difference between the incident light waves and the reflected light waves.

Embodiment 28

The system according to embodiment 27, the means further comprising:
a second optical filter disposed between the material and the analyzer,
the second optical filter being configured to permit a specific polarization the reflected light waves to pass from the material to the analyzer.

Embodiment 29

The system according to any of embodiments 22-27, the means comprising:
a conductive coil disposed at a target position on a surface of the material;
a power source electrically connected to the conductive coil; and
an analyzer configured to detect the magnetic characteristics of the conductive coil,
the power source being configured to transmit an alternating current (AC) signal to the conductive coil in a range of from 100 Hz to 1 GHz, and
the analyzer further comprising a processor in operable communication with a computer-readable medium having instructions stored thereon that, when executed, cause the processor:
to cause an alternating current (AC) signal to be transmitted to the conductive coil in a range of from 100 Hz to 1 GHz;

detect a signal response over the range; and
generate an M-H hysteresis loop.

Embodiment 30

The system according to any of embodiments 22-27, the means comprising:
a nano-, micro-, or mm-size probe made from a non-magnetic solid material;
a tip of the probe made from a magnetic material;
a piezoelement attached to the probe;
a power source electrically connected to the piezoelement; and
an analyzer,
the power source being configured to apply an AC voltage to the piezoelement,
the probe being disposed at a constant distance from the material, and
the analyzer being configured to detect a change in a resonant frequency of the probe.

Embodiment 31

The system according to embodiment 30, the probe being comprised of quartz.

Embodiment 32

A method for screening and health monitoring of materials, the method comprising:
embedding a material with magneto-electric nanoparticles (MENs); and
providing a means for detecting a magnetic signal from the material.

Embodiment 33

The method according to embodiment 32, the MENs being comprised of a ferromagnetic core and a piezoelectric shell surrounding the ferromagnetic core.

Embodiment 34

The method of embodiment 33, the ferromagnetic core being comprised of cobalt ferrite ($CoFe_2O_4$).

Embodiment 35

The method according to any of embodiments 33-34, the piezoelectric shell being comprised of barium titanate ($BaTiO_3$).

Embodiment 36

The method according to any of embodiments 32-35, a diameter of the MENs being a width within a range of from 10 nm to 100 nm.

Embodiment 37

The method according to any of embodiments 32-36, the means comprising:
a laser configured to direct incident laser light waves at a target area of the material;
an optical filter disposed between the laser and the material; and
an analyzer configured to detect the laser light reflected from the material,
the first optical filter being configured to permit a specific polarization of the incident light waves to pass from the laser to the material, and
the analyzer comprising a processor in operable communication with a computer-readable medium having instructions stored thereon that, when executed, cause the processor to detect a phase change difference between the incident light waves and the reflected light waves.

Embodiment 38

The method according to embodiment 37, the means further comprising:
a second optical filter disposed between the material and the analyzer,
the second optical filter being configured to permit a specific polarization the reflected light waves to pass from the material to the analyzer.

Embodiment 39

The method according to any of embodiments 32-36, the means comprising:
a conductive coil disposed at a target position on a surface of the material;
a power source electrically connected to the conductive coil; and
an analyzer configured to detect the magnetic characteristics of the conductive coil,
the power source being configured to transmit an alternating current (AC) signal to the conductive coil in a range of from 100 Hz to 1 GHz, and
the analyzer further comprising a processor in operable communication with a computer-readable medium having instructions stored thereon that, when executed, cause the processor:
to cause an alternating current (AC) signal to be transmitted to the conductive coil in a range of from 100 Hz to 1 GHz;
detect a signal response over the range; and
generate an M-H hysteresis loop.

Embodiment 40

The method according to any of embodiments 32-36, the means comprising:
a nano-, micro-, or mm-size probe made from a non-magnetic solid material;
a tip of the probe made from a magnetic material;
a piezoelement attached to the probe;
a power source electrically connected to the piezoelement; and
an analyzer,
the power source being configured to apply an AC voltage to the piezoelement,
the probe being disposed at a constant distance from the material, and
the analyzer being configured to detect a change in a resonant frequency of the probe.

A greater understanding of the present invention and of its many advantages may be had from the following example, given by way of illustration. The following example is illustrative of some of the methods, applications, embodiments and variants of the present invention. The example is, of course, not to be considered as limiting the invention. Numerous changes and modifications can be made with respect to the invention.

Example 1

Figure 5:
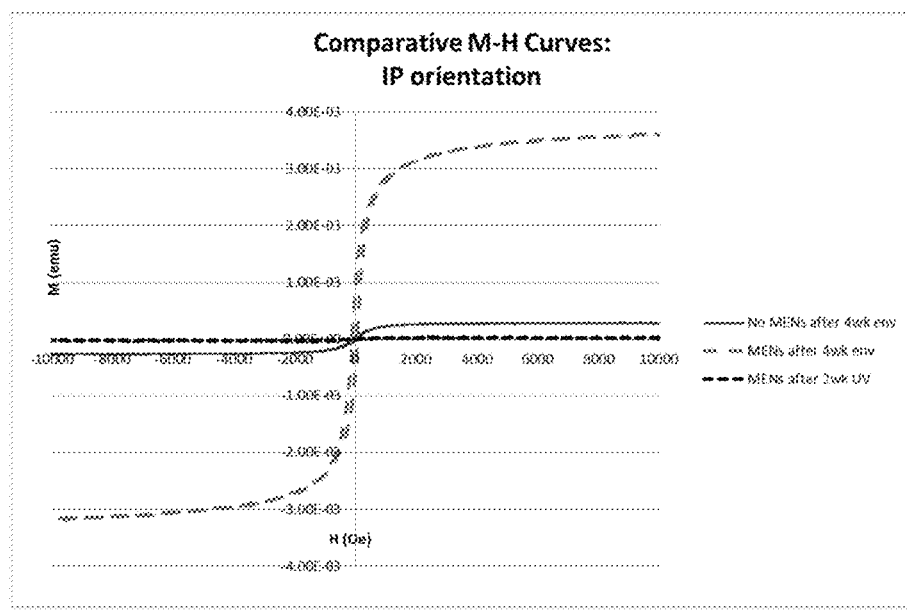
FIG. 5 shows a plot of comparative magnetic hysteresis (M-H) curves in an in-plane orientation.

Basic room-temperature M-H hysteresis loops of 30-nm MENs integrated into an adhesive bond (in the shape of a rectangular slab) during different stages of treatment and measured via vibrating sample magnetometery for an in-plane orientation are shown in FIG. 5. Comparative M-H curves in an in-plane (IP) orientation of MENs integrated into an adhesive bond during different stages of treatment at room temperature are shown in FIG. 5.

It can be noted that the nanoparticles induce almost an order of magnitude weaker signal after the bond is exposed to an ultraviolet (UV) waves. It should be mentioned that the signal measured through VSM directly reflects the quality of the bond in the vicinity of the nanoparticles and thus provides a quality control at the nanoscale. Similarly, under different treatment conditions, the signal could also go up by orders of magnitude.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section, if present) are incorporated by reference in their entirety, including all figures and tables, to the extent they are not inconsistent with the explicit teachings of this specification.

What is claimed is:

1. A system for screening and health monitoring of materials, the system comprising:
   a material embedded with magneto-electric nanoparticles (MENs);
   a laser configured to direct incident laser light waves at a target area of the material;
   a first optical filter disposed between the laser and the material; and
   an analyzer configured to detect a structural defect by measuring a magnetization at a local region of the material by detecting a change in light intensity between the incident laser light and laser light reflected from the local region of the material.

2. The system of claim 1, the MENs being comprised of a ferromagnetic core and a piezoelectric shell surrounding the ferromagnetic core.

3. The system of claim 1, the ferromagnetic core being comprised of cobalt ferrite ($CoFe_2O_4$).

4. The system of claim 1, the piezoelectric shell being comprised of barium titanate ($BaTiO_3$).

5. The system of claim 1, a diameter of the MENs being a width within a range of from 10 nm to 100 nm.

6. The system of claim 1, the first optical filter being configured to permit a specific polarization of the incident light waves to pass from the laser to the material.

7. The system of claim 1, the laser being a diode laser.

8. The system of claim 1, the laser being configured to emit light at a wavelength of 408 nm, 532 nm, and 650 nm.

9. The system of claim 6, further comprising a second optical filter disposed between the material and the analyzer; the second optical filter being configured to permit a specific polarization of the reflected light waves to pass from the material to the analyzer.

10. The system of claim 1, the analyzer being further configured to detect a structural defect by measuring a magnetization at a local region of the material by detecting a phase change between a phase of the incident laser light and a phase of the laser light reflected from the local region of the material.

11. A system for screening and health monitoring of materials, the system comprising:
    a material embedded with magneto-electric nanoparticles (MENs) comprised of a ferromagnetic core and a piezoelectric shell surrounding the ferromagnetic core;
    a diode laser configured to direct incident laser light waves at a target area of the material;
    a first optical filter disposed between the diode laser and the material;
    a second optical filter disposed between the material and the analyzer; and
    an analyzer configured to detect a structural defect by measuring a magnetization at local region of the material by either:
       detecting a change in light intensity between the incident laser light and the laser light reflected from the local region of the material; or
       detecting a change between a phase of the incident laser light and a phase of laser light reflected from the local region of the material,
    the ferromagnetic core being comprised of cobalt ferrite ($CoFe_2O_4$),
    the piezoelectric shell being comprised of barium titanate ($BaTiO_3$),
    a diameter of the MENs being a width within a range of from 10 nm to over 100 nm,
    the first optical filter being configured to permit a specific polarization of incident light waves to pass from the laser to the material, and
    the second optical filter being configured to permit a specific polarization of reflected light waves to pass from the material to the analyzer.

* * * * *